United States Patent
Satou et al.

(10) Patent No.: US 11,211,285 B2
(45) Date of Patent: Dec. 28, 2021

(54) METHOD OF PRODUCING BONDED WAFER AND BONDED WAFER

(71) Applicant: SUMCO Corporation, Tokyo (JP)

(72) Inventors: Youzou Satou, Tokyo (JP); Kazuaki Kozasa, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/962,311

(22) PCT Filed: Jan. 8, 2019

(86) PCT No.: PCT/JP2019/000240
§ 371 (c)(1),
(2) Date: Jul. 15, 2020

(87) PCT Pub. No.: WO2019/142700
PCT Pub. Date: Jul. 25, 2019

(65) Prior Publication Data
US 2020/0343130 A1    Oct. 29, 2020

(30) Foreign Application Priority Data
Jan. 17, 2018    (JP) .............................. JP2018-005914

(51) Int. Cl.
*H01L 21/762*    (2006.01)
*H01L 29/06*    (2006.01)

(52) U.S. Cl.
CPC .... *H01L 21/76251* (2013.01); *H01L 29/0649* (2013.01)

(58) Field of Classification Search
CPC ......... H01L 21/76251; H01L 21/02002; H01L 21/76254; H01L 21/3212; H01L 21/02;
(Continued)

(56) References Cited

U.S. PATENT DOCUMENTS 6,566,267 B1 * 5/2003 Wenski ............. H01L 21/02024
216/91
2008/0085943 A1    4/2008 Doura et al.
(Continued)

FOREIGN PATENT DOCUMENTS

JP    2006-190703 A    7/2006
JP    2008-207319 A    9/2008
(Continued)

OTHER PUBLICATIONS

English language translation of the International Search Report (ISR) from International Searching Authority (Japan Patent Office) in International Pat. Appl. No. PCT/JP2019/000240, dated Feb. 26, 2019.
(Continued)

*Primary Examiner* — Dao H Nguyen
(74) *Attorney, Agent, or Firm* — Greenblum & Bernstein, P.L.C.

(57) ABSTRACT

In a method of producing a bonded wafer, the amount of depression of the polishing cloth is 50 μm to 90 μm, and the surface hardness (ASKER C) of the polishing cloth is 50 to 60. In the bonded wafer, the polycrystalline silicon layer has a thickness variation Δt of 5% or less, and the support substrate wafer has a GBIR of 0.2 μm or less and an SFQR of 0.06 μm or less after the polycrystalline silicon layer is polished.

4 Claims, 5 Drawing Sheets

(58) Field of Classification Search
CPC .......... H01L 21/185; H01L 21/304; H01L 21/02532; H01L 21/02595; H01L 21/30625; H01L 29/0649; H01L 27/12; B24B 37/24; B24B 37/20
USPC .......... 438/455, 458, 459, 478, 479, 692; 257/49, 66, 629, 627, 479, E21.23, 257/E21.237, E21.331, E21.334, E21.567, 257/E29.105, E29.106, E29.107, E29.109
See application file for complete search history.

(56) References Cited

U.S. PATENT DOCUMENTS

| | | | |
|---|---|---|---|
| 2010/0317263 | A1 | 12/2010 | Hirose et al. |
| 2012/0149177 | A1* | 6/2012 | Nakayoshi .......... C30B 29/06 438/478 |
| 2012/0319121 | A1* | 12/2012 | Reynaud .......... H01L 21/76254 257/66 |
| 2017/0345663 | A1* | 11/2017 | Ishizuka .......... H01L 21/304 |
| 2018/0200861 | A1 | 7/2018 | Morinaga et al. |
| 2019/0221470 | A1 | 7/2019 | Kobayashi et al. |

FOREIGN PATENT DOCUMENTS

| | | |
|---|---|---|
| JP | 2015-071197 | 4/2015 |
| JP | 2016-136591 A | 7/2016 |
| JP | 2017-064894 A | 4/2017 |
| JP | 2017-220503 | 12/2017 |
| WO | 2017/013935 | 1/2017 |

OTHER PUBLICATIONS

International Preliminary Report on Patentability (IPRP) from the International Bureau of WIPO in International Pat. Appl. No. PCT/JP2019/000240, dated Jul. 21, 2020, together with an English language translation.

Office Action from Japan Patent Office (JPO) in Japanese Patent Appl. No. 2018-005914, dated Mar. 16, 2021, together with an English language translation.

Extended European Search Report (EESR) from European Patent Office (EPO) in European Patent Application No. 19740885.9, dated Aug. 27, 2021.

* cited by examiner

METHOD OF PRODUCING BONDED WAFER AND BONDED WAFER

TECHNICAL FIELD

This disclosure relates to a method of producing a bonded wafer and a bonded wafer.

BACKGROUND

Conventionally, bonded wafers in which a polycrystalline silicon layer is provided as a carrier trap layer immediately under a buried oxide film (so-called trap-rich bonded SOI wafers) have been proposed.

The above bonded SOI wafers are produced by bonding a wafer for an active layer (hereinafter, an active layer wafer) and a wafer for a support substrate (hereinafter, a support substrate wafer) having a polycrystalline silicon layer, with an oxide film provided as an insulating film therebetween. In such bonded wafers, voids would be formed in a bonding surface for example depending on the surface characteristics of the polycrystalline silicon layer. Against this backdrop, such polycrystalline silicon layers have been polished to reduce the formation of voids in bonding surfaces (for example, see JP 2016-136591 A (PTL 1)).

CITATION LIST

Patent Literature

PTL 1: JP 2016-136591 A

SUMMARY

Technical Problem

For polishing of a polycrystalline silicon layer as described above, it is desired that the polycrystalline silicon layer having been polished have little thickness variation and few microdefects, and that the flatness of the support substrate wafer be high.

It could therefore be helpful to provide a method of producing a bonded wafer making it possible to obtain a support substrate wafer having a polycrystalline silicon layer with little thickness variation, few microdefects, and high flatness; and a bonded wafer including a support substrate wafer having a polycrystalline silicon layer with little thickness variation, few microdefects, and high flatness.

Solution to Problem

This disclosure primarily includes the following features.

A method of producing a bonded wafer, according to this disclosure is a method of producing a bonded wafer by bonding a support substrate wafer and an active layer wafer with an insulating film therebetween, and includes:

a polycrystalline silicon deposition step of depositing a polycrystalline silicon layer on the support substrate wafer on the bonding surface side;

a polycrystalline silicon layer polishing step of polishing a surface of the polycrystalline silicon layer using a polishing cloth;

an insulating film formation step of forming the insulating film on at least one of a bonding surface of the support substrate wafer and a bonding surface of the active layer wafer; and a bonding step of bonding the polished surface of the polycrystalline silicon layer of the support substrate wafer and the active layer wafer with the insulating film therebetween.

When the amount of depression of the polishing cloth is defined as:

Amount of depression ($\mu$m)=Thickness of polishing cloth ($\mu$m)×Compression ratio (%/(N/cm$^2$))× Load (N/cm$^2$), the amount of depression of the polishing cloth is 50 $\mu$m to 90 $\mu$m, and the surface hardness (ASKER C) of the polishing cloth is 50 to 60.

Here, the "surface hardness (ASKER C) of the polishing cloth" is measured using an ASKER C durometer.

In the method of producing a bonded wafer, according to this disclosure, the polishing cloth is preferably a suede pad composed of a base and a nap layer.

In the above case, the thickness of the base is preferably 0.15 mm to 0.20 mm.

A bonded wafer of this disclosure includes a polycrystalline silicon layer deposited on a support substrate wafer.

The polycrystalline silicon layer has a thickness variation $\Delta t$ of 5% or less, and the support substrate wafer has a GBIR of 0.2 $\mu$m or less and an SFQR of 0.06 $\mu$m or less after the polycrystalline silicon layer is polished.

Here, the thickness variation ($\Delta t$) is calculated by the following formula based on infrared spectroscopy (FT-IR) measurements performed on the polished polycrystalline silicon layer having a radius of R from which 3 mm of a circumferential portion in the radial direction of the polycrystalline silicon layer is excluded, to measure the thicknesses of total nine positions: the center position in the radial direction (one position), four positions in a distance of R/2 from the center position in the radial direction (placed at intervals of 90° about the center position), and four positions at a distance of 3 mm inward from the circumferential portion in the radial direction (each placed on a line extended about the center position in the radial direction and one of the four positions at a distance of R/2 about the center position in the radial direction).

$\Delta t$=((Maximum thickness−Minimum thickness)/ (Maximum thickness+Minimum thickness))*100 (%)

Further, the "GBIR" (GrobalBackside Ideal focalplane Range) and the "SFQR" (Site Front least sQuares Range) are measured using a WaferSight 2 manufactured by KLA-Tencor Corporation.

Advantageous Effect

This disclosure can provide a method of producing a bonded wafer making it possible to obtain a support substrate wafer having a polycrystalline silicon layer with little thickness variation, few microdefects, and high flatness; and a bonded wafer having a support substrate wafer having a polycrystalline silicon layer with little thickness variation, few microdefects, and high flatness.

DETAILED DESCRIPTION

An embodiment of a method of producing a bonded wafer, according to this disclosure will now be described in detail with reference to the drawings.

<Method of Producing Bonded Wafer>

Figure 1:
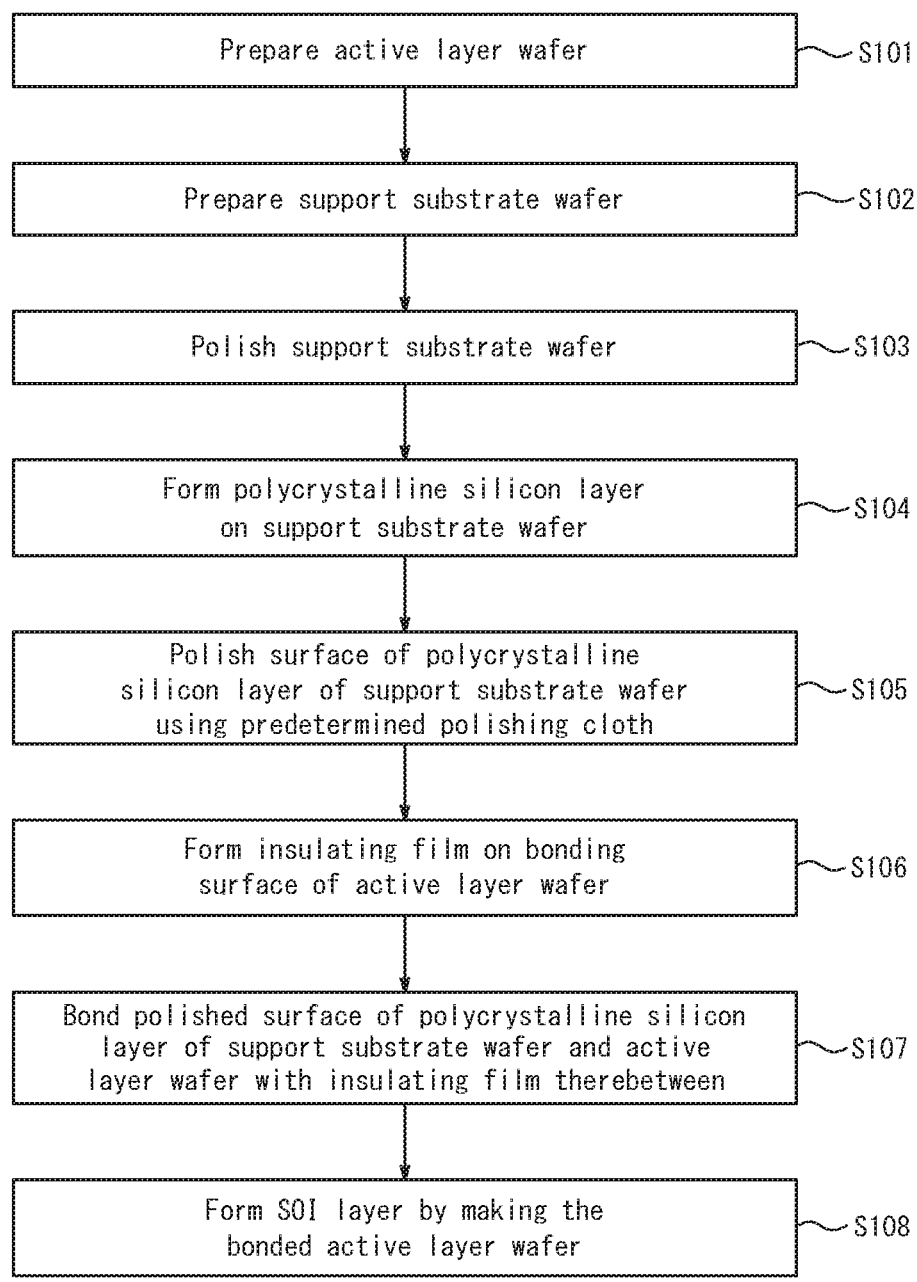
FIG. 1 is a flow diagram of a method of producing a bonded wafer, according to one embodiment of this disclosure.
Figure 2:
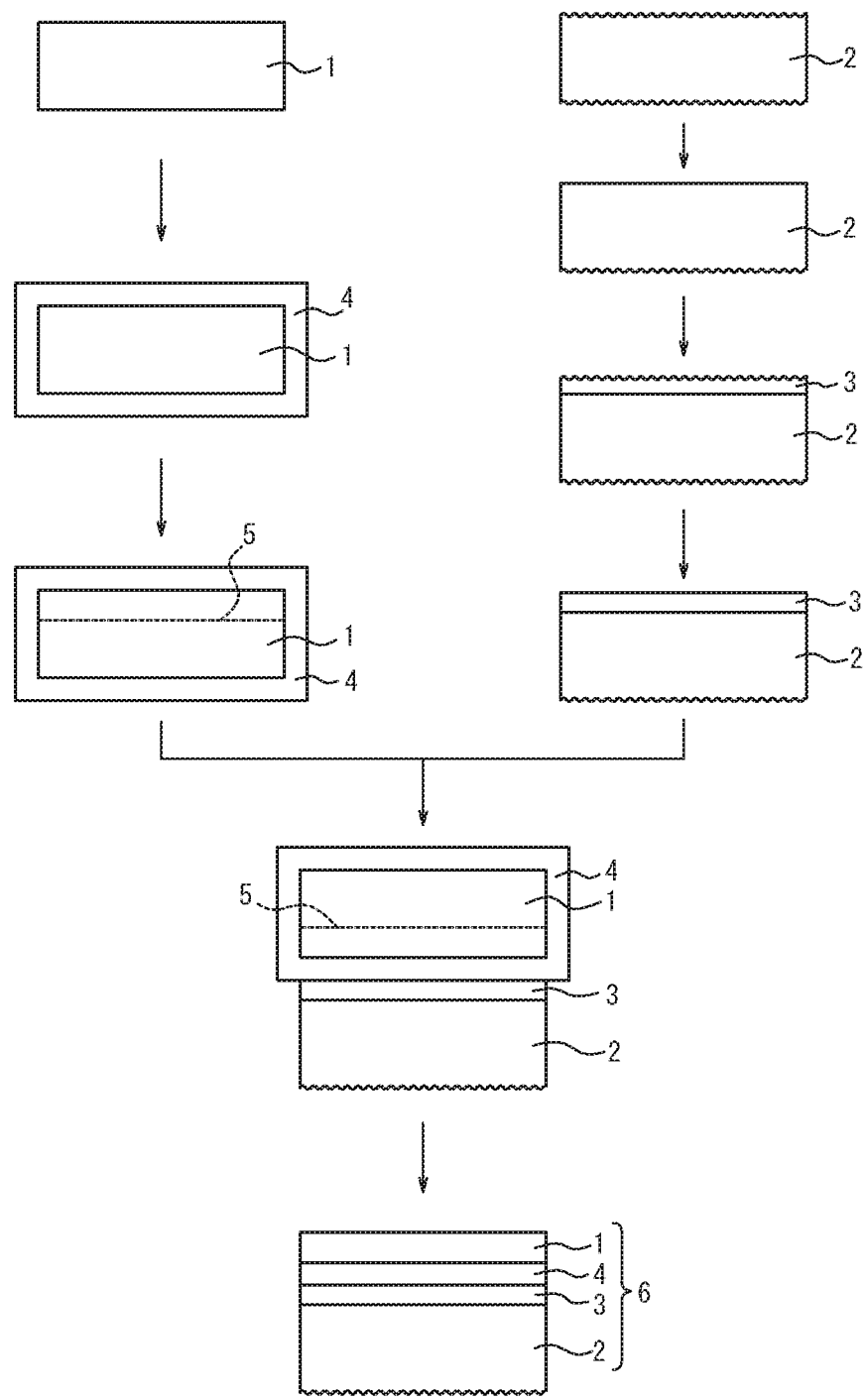
FIG. 2 presents cross-sectional views illustrating steps of a method of producing a bonded wafer, according to one embodiment of this disclosure.

FIG. 1 is a flow diagram of a method of producing a bonded wafer, according to one embodiment of this disclosure. FIG. 2 presents cross-sectional views illustrating steps of a method of producing a bonded wafer, according to one embodiment of this disclosure. As illustrated in FIG. 1 and FIG. 2, in this embodiment, first, an active layer wafer 1 is prepared (step S101) and a support substrate wafer 2 is prepared (step S102). The active layer wafer 1 and the support substrate wafer 2 are both single crystal silicon wafers in this embodiment, but not limited thereto. In particular, the active layer wafer 1 used preferably has a resistivity of 100 Ω·cm or more.

As illustrated in FIG. 1 and FIG. 2, in this embodiment, one surface of the support substrate wafer 2 is subjected to polishing (step S103). The polishing can be performed by a typical method, for example, in three stages of primary polishing, secondary polishing, and finish polishing each under typical polishing conditions. When the diameter of the support substrate wafer 2 is 300 mm or more, double-side polishing and single-side polishing can be performed.

Subsequently, as illustrated in FIG. 1 and FIG. 2, a polycrystalline silicon layer 3 is deposited on the support substrate wafer 2 (polycrystalline silicon layer deposition step)(step S104). The polycrystalline silicon layer 3 may be deposited by, for example, CVD. The thickness of the polycrystalline silicon layer is preferably 2 μm to 4 μm.

Next, in this embodiment, as illustrated in FIG. 1 and FIG. 2, a surface of the polycrystalline silicon layer 3 of the support substrate wafer 2 is subjected to polishing using a predetermined polishing cloth (polycrystalline silicon layer polishing step)(step S105). Here, in this embodiment, the amount of depression of the predetermined polishing cloth is 50 μm to 90 μm, and the surface hardness (ASCER C) of the polishing cloth is 50 to 60. Note that the definitions of the "the amount of depression" and the "surface hardness (ASCER C)" are as described above.

In this embodiment, the polishing cloth is a suede pad composed of a base and a nap layer, and the nap layer has two layers. Alternatively, the nap layer may have one layer or three or more layers. The base may be made of for example PET. The thickness of the base is preferably 0.15 mm to 0.20 mm. The thickness of the nap layer (the total thickness in the case of a plurality of layers) is preferably around 0.5 mm to 0.9 mm, more preferably around 0.5 mm to 0.7 mm. In particular, when the nap layer has two layers, the thickness of the surface layer is preferably around 0.3 mm to 0.5 mm, and the thickness of the second layer (the layer between the surface layer and the base) is preferably around 0.15 mm to 0.20 mm. This is preferred to achieve the above amount of depression and the surface hardness.

In the polycrystalline silicon layer polishing step (step S105), a known abrasive such as colloidal silica can be used, and the polishing conditions preferably include a polishing pressure of 2500 N/cm$^2$ to 3000 N/cm$^2$, a polishing pad rotation speed of 30 rpm to 50 rpm, a work rotation speed of 30 rpm to 50 rpm, and an amount removed by polishing of 400 nm.

It should be noted that although not shown in FIG. 1 and FIG. 2, after the polycrystalline silicon layer polishing step (step S105), a cleaning step for removing particles may be performed.

Next, in this embodiment, as illustrated in FIG. 1 and FIG. 2, an insulating film 4 is formed on the bonding surface of the active layer wafer 1 (step S106). For example, the insulating film 4 may be an oxide film. The oxide film can be formed by oxide film growth for example by thermal oxidation. Note that an ion-implanted layer 5 for separation may be formed by implanting hydrogen ions or rare gas ions from above the oxide film 4 using an ion implanter (see FIG. 2). In that case, the ion implantation acceleration voltage and others can be controlled so that a target thickness of an SOI silicon layer can be obtained.

Subsequently, in this embodiment, as illustrated in FIG. 1 and FIG. 2, the polished surface of the polycrystalline silicon layer 3 of the support substrate wafer 2 and the active layer wafer 1 are bonded with the insulating film 4 (the oxide film in this example) therebetween (step S107).

Next, the active layer wafer is made into a thin film, thus an SOI layer is formed (step S108). For example, the bonded wafer is subjected to heat treatment (separation heat treatment) for forming a micro-bubble layer in the ion-implanted layer 5, and separation is performed in the formed micro-bubble layer, thus a bonded wafer 6 is fabricated in which the insulating film 4 and an SOI layer are formed on the support substrate wafer 2.

Here, as illustrated in FIG. 2, before the bonding step of bonding the active layer wafer 1 and the support substrate wafer 2 (step S107), steps involving the active layer wafer 1 (step S101, step S106) and steps involving the support substrate wafer 2 (step S102, step S103, step S104, step S105) may be performed separately: accordingly, in this disclosure, either the steps involving the active layer wafer 1 (step S101, step S106) or the steps involving the support substrate wafer 2 (step S102, step S103, step S104, step S105) may be performed first and both may be performed concurrently.

Figure 3:
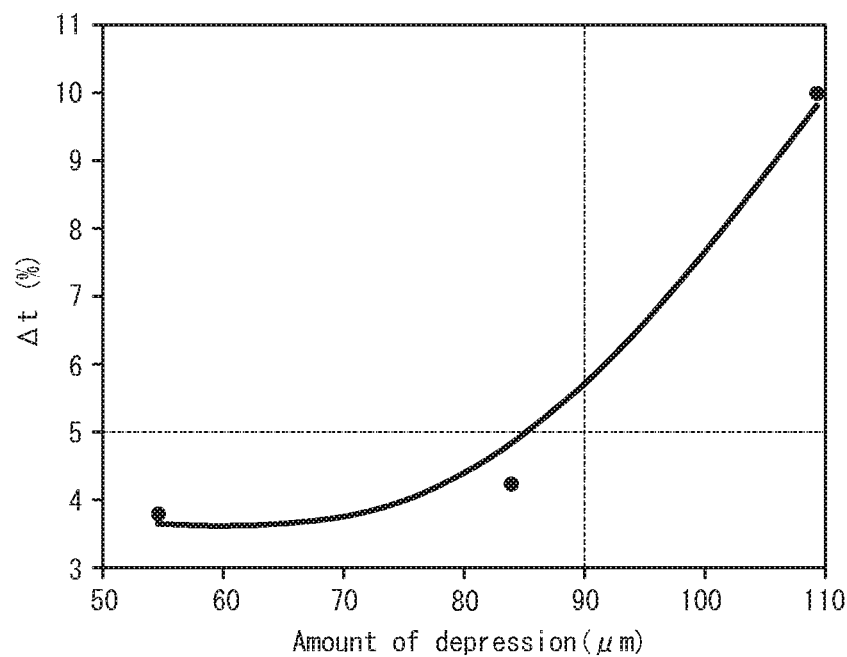
FIG. 3 is a diagram illustrating the relationship between the amount of depression of a polishing cloth and the thickness variation Δt of a polycrystalline silicon layer.
Figure 4:
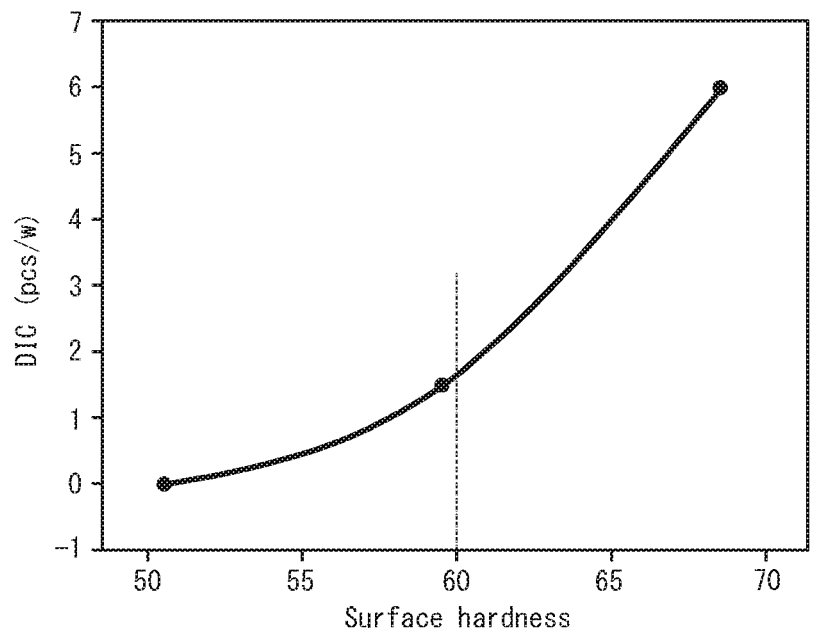
FIG. 4 is a diagram illustrating the relationship between the surface hardness (ASKER C) of a polishing cloth and DICs.

The operation and effect of the method of producing a bonded wafer, according to this embodiment will now be described. FIG. 3 is a diagram illustrating the relationship between the amount of depression of the polishing cloth and the thickness variation Δt of the polycrystalline silicon layer (the polishing pressure is 2700 N/cm$^2$). FIG. 4 is a diagram illustrating the relationship between the surface hardness (ASKER C) of a polishing cloth and the number of DIC defects (number of microdefects per wafer).

Here, DIC (differential interference contrast) refers to a defect detected using Bright-Field-Channel of SP2 manufactured by KLA Tencor. A feature of the system is that it can detect step defects having a width of the order of several tens of micrometers to millimeters and a height of the order of several nanometers.

FIG. 3 demonstrates that the thickness variation Δt of the polycrystalline silicon layer can be reduced by using a polishing cloth having a small amount of depression (particularly 90 μm or less). This indicates that the use of such a polishing pad makes uniform the stress distribution in the polished surface and allows for more smooth polishing. This will also be the case for the flatness.

On the other hand, FIG. 4 demonstrates that a higher surface hardness of the polishing cloth causes more DICs. This indicates that when a polishing cloth having a high surface hardness is used, polishing cannot act on the inside of the grain boundaries present in the surface of the polycrystalline silicon layer, and thus the oxide film inside the grain boundaries cannot effectively removed. Accordingly, for example, more DICs will be formed if a polishing cloth simply having a high hardness is used to reduce the amount of depression.

On the other hand, in this embodiment, in the step of polishing using a predetermined polishing cloth on the surface of the polycrystalline silicon layer 3 of the support substrate wafer 2 (step S105), the amount of depression of the predetermined polishing cloth used is 50 μm to 90 μm, and the surface hardness (ASCER C) of the polishing cloth used is 50 to 60. This can result in a smaller thickness variation and fewer microdefects of the polished polycrystalline silicon layer, and higher flatness of the support substrate wafer 2 having been subjected to the polishing on the polycrystalline silicon layer 3.

In the method of producing a bonded wafer, according to this disclosure, the polishing cloth is preferably a suede pad composed of a base and a nap layer. Such a polishing cloth is preferred to obtain the amount of depression and the surface hardness (ASKER C) mentioned above.

Here, the thickness of the base is preferably 0.15 mm to 0.20 mm. Such a thickness is preferred to obtain the amount of depression and the surface hardness (ASKER C) mentioned above. The material of the base is preferably PET.

<Bonded Wafer>

A bonded wafer obtained by the method of producing a bonded wafer, according to this embodiment, has a polycrystalline silicon layer having a thickness variation Δt of 5% or less, and the GBIR of the polycrystalline silicon layer having been polished is 0.2 μm or less and the SFQR thereof is 0.06 μm or less, as will be described in Examples.

An embodiment of this disclosure has been described above; however, this disclosure is in no way limited to the above embodiment. For example, although the insulating film 4 is formed on only one side of the active layer wafer 1 in the above embodiment, the insulating film 4 may be formed only on the support substrate wafer 2, or may be formed on each of the active layer wafer 1 and the support substrate wafer 2. Further, this disclosure can be applied to various methods of producing a bonded wafer in which a polished surface of a polycrystalline silicon layer constitutes a bonding surface. In particular, this disclosure can suitably be used to produce a trap-rich bonded SOI wafer.

Examples of this disclosure will now be described; however, the disclosure is not limited to the Examples.

Examples

With a view to confirming the advantageous effects of this disclosure, a test of polishing a polycrystalline silicon layer was performed using a single-wafer processing polishing system. The polycrystalline silicon layer was of p-type, and the thickness of the layer before being polished was approximately 780 sm. The polishing included pre-stage polishing and finish polishing, and different pre-stage polishing conditions were used in Example and Comparative Examples.

In Example, a suede pad (two nap layers and a rigid plastic plate base) was used as a polishing cloth. For the suede pad, the thickness was 0.87 mm (the thickness of the nap layer adjacent to the base was 0.30 mm, the thickness of the nap layer on the surface layer side was 0.40 mm, and the thickness of the rigid plastic plate base was 0.17 mm), the amount of depression was 83.85 μm, and the surface hardness (ASKER C) was 59.5. The polishing conditions included rotation speeds of the pad and the work of 32 rpm, and a processing pressure of 2700 N/cm$^2$. Colloidal silica was used as an abrasive. The amount removed by polishing was 400 nm or more.

To make comparison with respect to Δt, GBIR, and SFQR, in Comparative Example 1, a suede pad having a different thickness and a different hardness was used. The thickness of the pad was 1.07 mm, the amount of depression was 109.2 μm, and the surface hardness (ASKER C) was 50.5. The rotation speeds of the pad and the work were 32 rpm, and the processing pressure was 2700 N/cm$^2$. Further, to make comparison with respect to the number of DICs, in Comparative Example 2, a suede pad having a thickness of 0.72 μm, an amount of depression of 54.6 μm, and a surface hardness (ASKER C) of 68.5 was used. The thickness difference between the pads of Comparative Example 1 and Comparative Example 2 and the pad of Example was the difference in the thickness of the nap layer adjacent to the base.

The evaluation items and the evaluation methods are described below.

<Thickness Variation Δt>

The thickness variation (Δt) was calculated by the following formula based on infrared spectroscopy (FT-IR) measurements performed on a polished polycrystalline silicon layer having a radius of R from which 3 mm of a circumferential portion in the radial direction of the polycrystalline silicon layer was excluded, to measure the thicknesses of total nine positions: the center position in the radial direction (one position), four positions in a distance of R/2 about the center position in the radial direction (placed at intervals of 90° about the center position), and four positions at a distance of 3 mm inward from the circumferential portion in the radial direction (each placed on a line extended about the center position in the radial direction and one of the four positions at a distance of R/2 from the center position in the radial direction).

$$\Delta t = ((\text{Maximum thickness} - \text{Minimum thickness}) / (\text{Maximum thickness} + \text{Minimum thickness})) * 100 \, (\%)$$

<Number of Microdefects>

The surface of the polycrystalline silicon layer having been polished was subjected to a measurement using the DIC mode (measurement mode using the DIC method) of a wafer surface inspection system (Surfscan SP2 manufactured by KLA-Tencor Corporation).

<Flatness>

The GBIR and the SFQR of the support substrate wafer after polishing the polycrystalline silicon layer were measured using WaferSight 2 manufactured by KLA-Tencor Corporation.

Figure 5:
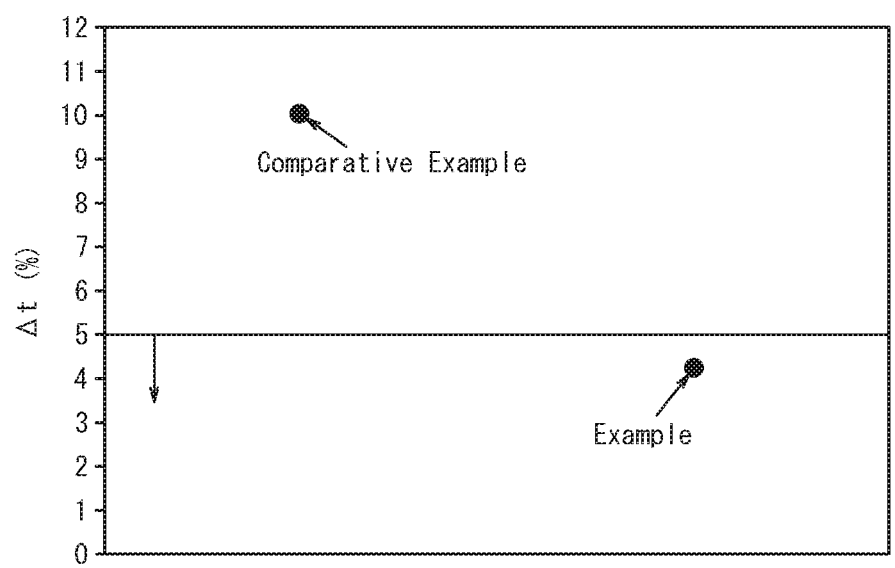
FIG. 5 is a diagram illustrating the measurement results of the thickness variation Δt in Examples.
Figure 6:
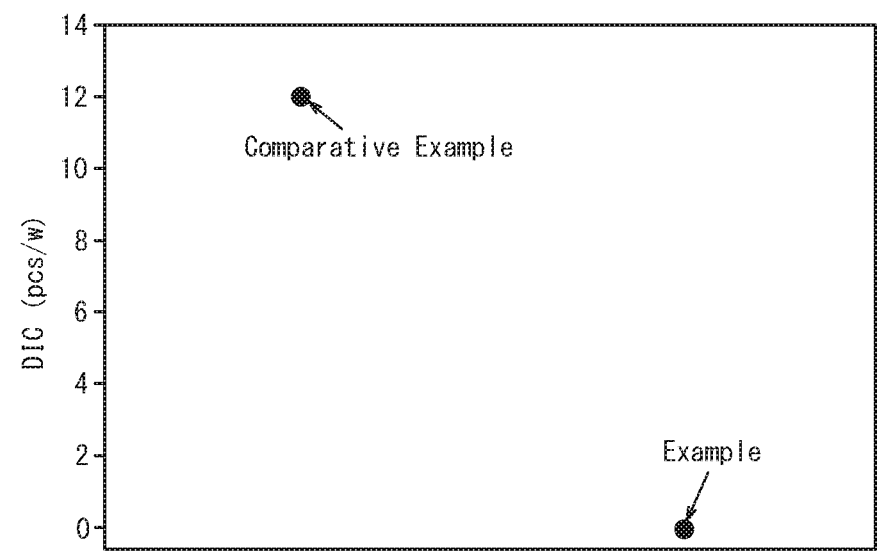
FIG. 6 is a diagram illustrating the number of DICs in Examples.
Figure 7:
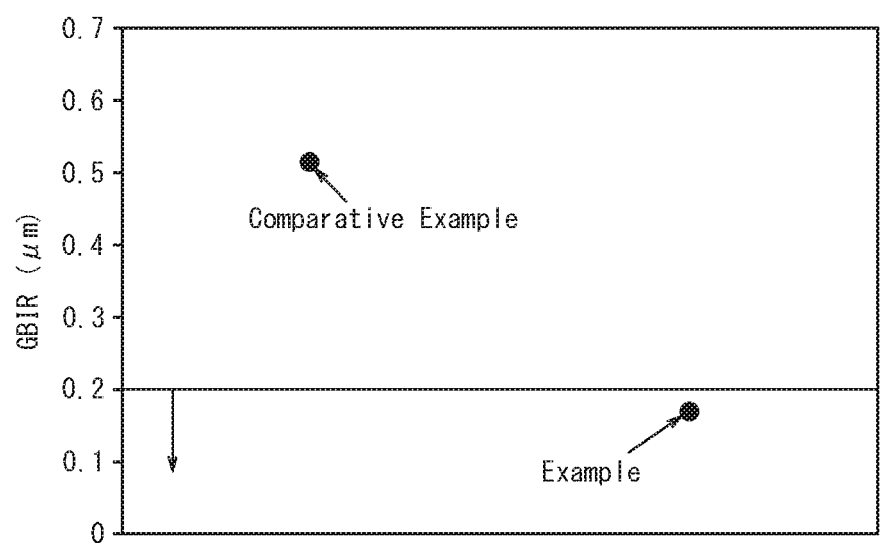
FIG. 7 is a diagram illustrating the measurement results of the GBIR in Examples.
Figure 8:
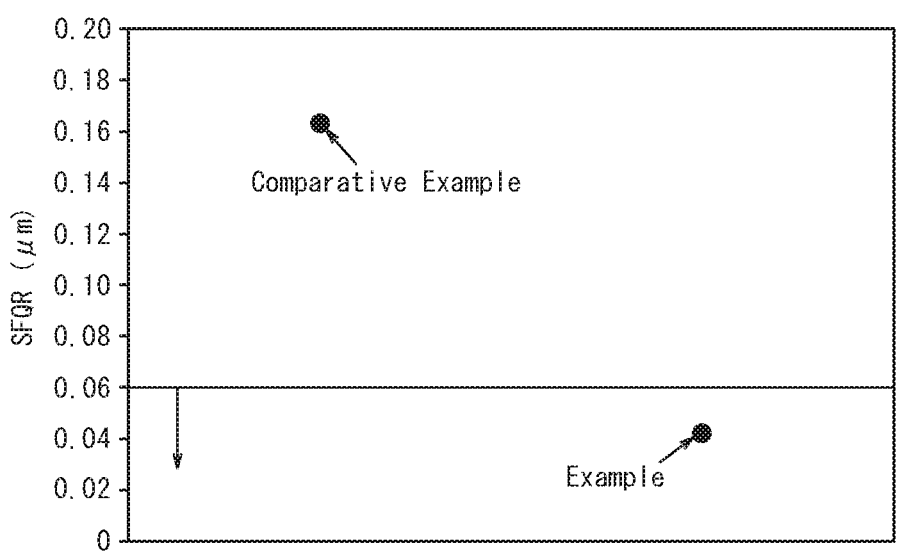
FIG. 8 is a diagram illustrating the measurement results of the SFQR in Examples.

FIG. 5 is a diagram illustrating the measurement results of the thickness variation Δt in EXMPLE. FIG. 6 is a diagram illustrating the measurement results for DICs in Examples. FIG. 7 is a diagram illustrating the measurement results of the GBIR in Examples. FIG. 8 is a diagram illustrating the measurement results of the SFQR in Examples.

As illustrated in FIG. 5 to FIG. 8, in Example, Δt was 5% or less, the GBIR was 0.2 μm or less, and the SFQR was 0.06 μm or less. In Example, the polycrystalline silicon layer (having been polished) obtained had a smaller thickness variation, fewer DIC defects, and higher flatness as compared with Comparative Examples.

REFERENCE SIGNS LIST

1: Active layer wafer
2: Support substrate wafer
3: Polycrystalline silicon layer
4: Insulating film
5: Ion-implanted layer
6: Bonded wafer

The invention claimed is:

1. A method of producing a bonded wafer by bonding a support substrate wafer and an active layer wafer with an insulating film therebetween, comprising:
 a polycrystalline silicon deposition step of depositing a polycrystalline silicon layer on the support substrate wafer on the bonding surface side;
 a polycrystalline silicon layer polishing step of polishing a surface of the polycrystalline silicon layer using a polishing cloth:
 an insulating film formation step of forming the insulating film on at least one of a bonding surface of the support substrate wafer and a bonding surface of the active layer wafer; and
 a bonding step of bonding the polished surface of the polycrystalline silicon layer of the support substrate wafer and the active layer wafer with the insulating film therebetween,
 wherein when an amount of depression of the polishing cloth is defined as:

Amount of depression (μm)=Thickness of polishing cloth (μm)×Compression ratio (%/(N/cm$^2$))× Load (N/cm$^2$), the amount of depression of the polishing cloth is 50 μm to 90 μm, and a surface hardness (ASKER C) of the polishing cloth is 50 to 60.

2. The method of producing a bonded wafer, according to claim 1, wherein the polishing cloth is a suede pad composed of a base and a nap layer.

3. The method of producing a bonded wafer, according to claim 2, wherein the thickness of the base is 0.15 mm to 0.20 mm.

4. A bonded wafer comprising a polycrystalline silicon layer deposited on a support substrate wafer,
 wherein the polycrystalline silicon layer has a thickness variation Δt of 5% or less, and
 the support substrate wafer has a GBIR of 0.2 μm or less and an SFQR of 0.06 μm or less after the polycrystalline silicon layer is polished.

* * * * *